United States Patent [19]

Higuchi et al.

[11] 4,342,103
[45] Jul. 27, 1982

[54] ADDRESS BUFFER CIRCUIT

[75] Inventors: Mitsuo Higuchi, Tokyo; Kiyoshi Miyasaka, Yokohama, both of Japan

[73] Assignee: Fujitsu Limited, Kawasaki, Japan

[21] Appl. No.: 171,272

[22] Filed: Jul. 23, 1980

[30] Foreign Application Priority Data

Jul. 27, 1979 [JP] Japan .................................. 54-95836

[51] Int. Cl.³ .............................................. G11C 8/00
[52] U.S. Cl. .................................... 365/230; 365/201
[58] Field of Search ............... 365/200, 201, 218, 222, 365/230

[56] References Cited

U.S. PATENT DOCUMENTS 4,074,148 2/1978 Sato ...................................... 365/230
4,104,733 8/1978 Satoh .................................... 365/230
4,110,639 8/1978 Redwine ............................. 365/230

Primary Examiner—Stuart N. Hecker
Attorney, Agent, or Firm—Staas & Halsey

[57] ABSTRACT

An address buffer circuit is used in a memory device, for example in an EPROM device, and enables high speed testing of the memory device. The address buffer circuit can output "1" or "0" from both a positive output terminal and a negative output terminal when an input word address signal having a signal level different from the usual signal level is applied to an input of the address buffer circuit, so that a plurality of word lines can be selected at a time.

17 Claims, 5 Drawing Figures

ADDRESS BUFFER CIRCUIT

BACKGROUND OF THE INVENTION (1) Field of the Invention

The present invention relates to an address buffer circuit, more particularly to an address buffer circuit which is used in a memory device, for example, in an EPROM (Erasable and Programmable Read Only Memory), and which enables high speed testing of the memory device.

(2) Description of the Prior Art

In general, a semiconductor memory device such as an EPROM or RAM device is put to various operation tests before shipment from a factory. For example, the functions of reading-out and writing-in of test data are tested under various conditions. Such reading-out and writing-in tests are effected for all memory cells contained in the memory device.

However, since a conventional memory device can select only a word, consisting for example of one bit, at a time, the reading-out and writing-in tests are effected for only a single word at a time. Therefore, it takes a long time to test one memory device. Moreover, in recent years, the capacity of memory devices has become very large due to the increase in the degree of integration of the memory devices, and thus the above-mentioned tests require a very long time. In particular in EPROM devices which have a relatively long writing-in time, the tests, which include a writing-in process, take a very long time.

An example of a prior art memory device is disclosed in the thesis "A 4K static Clocked and Nonclocked RAM Design," by Timothy R. O'Connel et al., the DIGEST OF TECHNICAL PAPERS In IEEE International Solid-State Circuits Conference, February 1977, PP 14–15.

SUMMARY OF THE INVENTION

In order to solve the aforementioned problem, circuit of the present invention selects a plurality of word lines when the operation tests are effected and, then selects a single word line when the usual writing-in or reading-out is effected.

It is the principal object of the present invention to reduce the time required for testing a memory device.

According to the present invention, there is provided a word address buffer circuit which can output "1" or "0" from both a positive output terminal and a negative output terminal when an input word address signal having a level which is higher than the usual "high" level is applied to an input of the word address buffer circuit, so that a plurality of word lines, for example two word lines, can be selected at the same time.

DETAILED DESCRIPTION OF THE PREFERRED EMBODIMENTS

Figure 1:
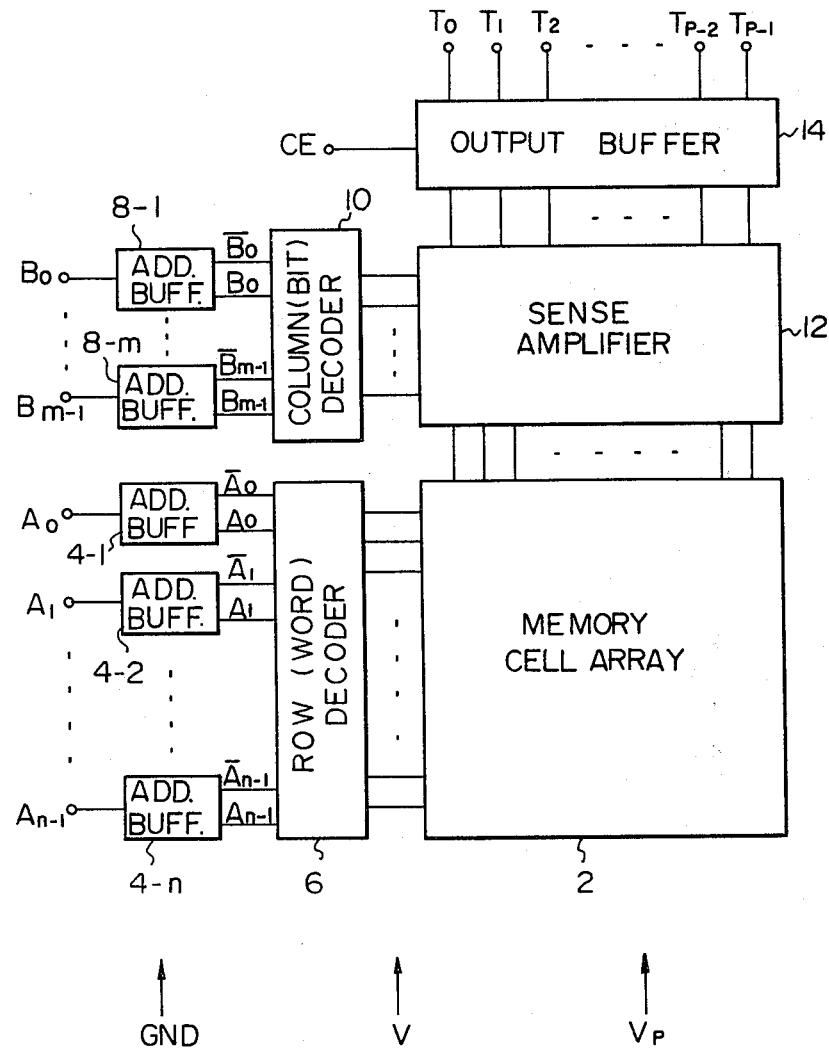
FIG. 1 is a block diagram illustrating an EPROM device including address buffer circuits according to the present invention.

FIG. 1 illustrates the structure of an EPROM device including word address buffer circuits in accordance with the present invention. The EPROM device of FIG. 1 comprises a memory cell array composed of a plurality of memory cells disposed in a matrix of rows and columns. Each of the memory cells is composed of, for example, a well known floating gate type field effect transistor. The EPROM of FIG. 1 also comprises: word address buffers 4-1, 4-2, - - - , 4-n which accept input word address signals $A_0$, $A_1$, - - - , $A_{n-1}$ and provide negative (or inverted) and positive (or non-inverted) word address output signals $\bar{A}_0$, $A_0$, $\bar{A}_1$, $A_1$, - - - , $\bar{A}_{n-1}$, $A_{n-1}$; a word address decoder or row address decoder 6 which decodes the output signals $\bar{A}_0$, $A_0$, $\bar{A}_1$, $A_1$, - - - , $\bar{A}_{n-1}$, $A_{n-1}$ and applies the decoded row address signals to the memory cell array 2; bit address buffers 8-1, 8-2, - - - , 8-m which accept input bit address signals $B_0$, $B_1$, - - - , $B_{m-1}$ and provide negative and positive bit address output signals $\bar{B}_0$, $B_0$, $\bar{B}_1$, $B_1$, - - - , $\bar{B}_{m-1}$, $B_{m-1}$; a bit address decoder or column address decoder 10 which decodes the output signals $\bar{B}_0$, $B_0$, $\bar{B}_1$, $B_1$, - - - , $\bar{B}_{m-1}$, $B_{m-1}$ and provides the decoded column address signal outputs. The EPROM of FIG. 1 further comprises a sense amplifier 12 which amplifies outputs from the memory cells in the memory cell array 2 selected by the decoded column address signals from the bit address decoder 10, and an output buffer 14 which amplifies outputs from the sense amplifier 12 and reads out output signals of p bits, i.e., a word, to terminals $T_0$, $T_1$, - - - , $T_{p-1}$ when a "high" level signal is applied to chip enable terminal CE. The output buffer 14 also includes a program circuit which writes in input information from the terminals $T_0$, $T_1$, - - - $T_{p-1}$ through the same amplifier 12 to the selected memory cells in the memory cell array 2 when a "low" level signal is applied to a chip enable terminal CE and "high" voltage is applied to a program power supply $V_p$.

The usual reading-out of information from the above-mentioned EPROM is effected by applying the n bit word address signals $A_0$ through $A_{n-1}$ to the word address buffers 4-1 through 4-n, the m bit bit address signals $B_0$ through $B_{m-1}$ to the bit address buffers 8-1 through 8-m, and a "high" level signal to the chip enable terminal CE. Output data of a word, i.e., p bits from a selected word appears at the terminal $T_0$ through $T_{p-1}$, through the sense amplifier 12 and the output buffer 14.

The usual writing-in of information to the EPROM is effected by applying the n bit word address signals $A_0$ through $A_{n-1}$ to the word address buffers 4-1 through 4-n, the m bit bit address signals $B_0$ through $B_{m-1}$ to the bit address buffers 8-1 through 8-m, the "high" voltage to the program power supply $V_p$, and a "low" level voltage to the chip enable terminal CE. The p bit data to be written-in is applied to the terminals $T_0$ through $T_{p-1}$ of the EPROM device. In this case, the output buffer 14 is switched to operate as the program circuit due to the supply of the "low" level voltage to the chip enable terminal CE and the "high" voltage to the program power supply $V_p$. Therefore, the data to be written in passes from the terminal $T_0$ through $T_{p-1}$ through the output buffer 14, which operates as the program circuit, and the sense amplifier 12 to the memory cell array 2, and the writing-in of information to the selected word is effected.

When it is necessary to erase the content of the EPROM device, the content can be erased by exposing the chip of the EPROM device to strong ultraviolet light from an ultraviolet light source.

Figure 2:
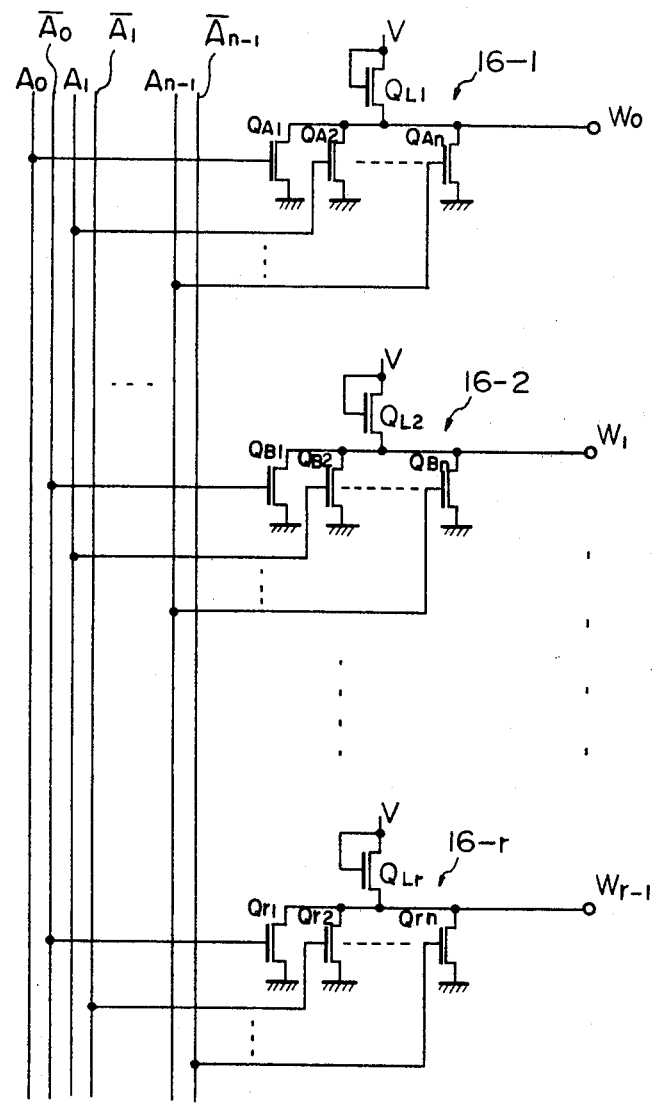
FIG. 2 is a schematic circuit diagram illustrating word address decoder circuits used in the EPROM device of FIG. 1.

As illustrated in FIG. 2, the word address decoder 6 used in the EPROM of FIG. 1 comprises r NOR gates 16-1, 16-2, - - -, 16-r. Each of the NOR gates is composed of a parallel connection of n inverter transistors and a load transistor. For example, the NOR gate 16-1 is composed of n inverter transistors $Q_{A1}$, $Q_{A2}$, - - -, $Q_{An}$ and a load transistor $Q_{L1}$. The gate electrodes of the inverter transistors $Q_{A1}$, $Q_{A2}$, - - - $Q_{An}$ of the NOR gate 16-1 are connected to the address lines $A_0$, $A_1$, - - -, $A_{n-1}$, and the gate electrodes of the inverter transistors $Q_{B1}$, $Q_{B2}$, - - -, $Q_{Bn}$ of the NOR gate 16-2 are connected to the address lines $\overline{A}_0$, $A_1$, $A_2$, - - -, $A_{n-1}$. The address lines $\overline{A}_0$, $A_0$, $\overline{A}_1$, $A_1$, - - -, $\overline{A}_{n-1}$, $A_{n-1}$ are connected to the corresponding outputs of the word address buffers 4-1, 4-2, - - -, 4-n (FIG. 1). Each of the NOR gates provides a "high" level output when all of the gate electrodes of the inverter transistors of the NOR gate are caused to be a "low" level and provides a "low" level output when at least one of the gate electrodes of the inverter transistors of the NOR gate is caused to be a "high" level.

In the usual reading-out or writing-in operation, if the address signals $A_0$, $A_1$, - - -, $A_{n-1}$ applied to the input terminals of the word address buffer 4-1, 4-2, - - -, 4-n (FIG. 1) are all "0," i.e., "low," only one NOR gate 16-1 outputs a "high" level and only one word line $W_0$ is selected. If the address signal $A_0$ is "1," i.e., a high" level, and the other address signals $A_0$, $A_1$, - - -, $A_{n-1}$ are all "0," only one NOR gate 16-2 outputs a "high" level and only one word line $W_1$ is selected.

When the operation tests are effected, the address signal, for example, $A_0$ is caused to be a "high" level whose voltage level is higher than that of the "high" level of the usual address signal, and the address signals $A_1$, $A_2$, - - -, $A_{n-1}$ are caused to be a "low" level, i.e., 0 V. In this condition, the word address buffer 4-1 outputs a "low" level signal from both the negative output $\overline{A}_0$ and the positive output $A_0$, and thus, both of the NOR gates 16-1 and 16-2 output "high" level signals so that two word lines $W_0$ and $W_1$ are selected at the same time.

Figure 3:
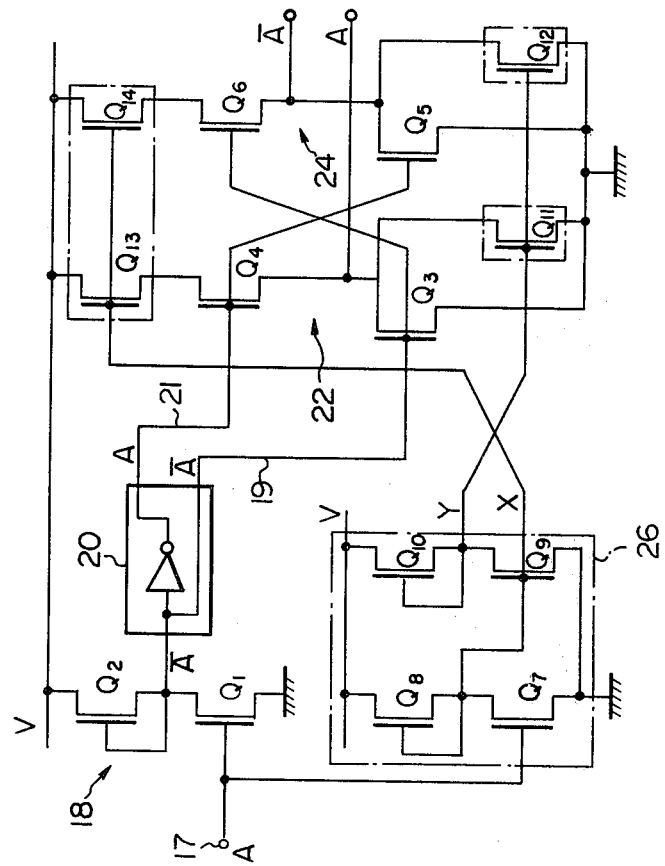
FIG. 3 is a circuit diagram illustrating a first embodiment of a word address buffer circuit in accordance with the present invention.

FIG. 3 illustrates the circuit of the word address buffer as the first embodiment of the present invention. The word address buffer circuit of FIG. 3 comprises: a first input buffer 18 consisting of two field effect transistors $Q_1$ and $Q_2$; an inverter circuit 20 which provides positive and negative outputs having shaped waveforms; a positive output buffer 22 consisting of field effect transistors $Q_3$ and $Q_4$; and a negative output buffer 24 consisting of field effect transistors $Q_5$ and $Q_6$. The word address buffer circuit of FIG. 3 further comprises, according to the present invention; a second input buffer 26 which consists of four field effect transistors $Q_7$ through $Q_{10}$ and which operates only when an input signal having a higher level than the usual "high" level is applied; clamping transistors $Q_{11}$ and $Q_{12}$ which clamp both the positive output A and negative output $\overline{A}$ of the word address buffer of FIG. 3 to "low" level when the operation tests are effected; and shut off transistors $Q_{13}$ and $Q_{14}$ whose main current paths are connected in series between the drain electrodes of the transistors $Q_4$ and $Q_6$ and a voltage source V, and which are cut off when the operation tests are effected.

Operation of the address buffer circuit of FIG. 3 will now be described. When the usual writing-in or reading-out operation is effected, the address signal A having a usual "high" level, for example 5 V, and having "low" level, for example 0 V, is applied to the input terminal 17. If the usual "high" level address signal is applied to the input terminal 17, the transistor $Q_1$ of the first input buffer 18 turns on, but the transistor $Q_7$ of the second input buffer 26 does not turn on, because the transistor $Q_7$ has a higher threshold level than the transistor $Q_1$. In this condition, the transistor $Q_9$ of the second input buffer is turned on so that the output Y of the second input buffer 26 becomes "low" and the output X of the second input buffer 26 becomes "high." Therefore, the clamping transistors $Q_{11}$ and $Q_{12}$ are turned off and the shut off transistors $Q_{13}$ and $Q_{14}$ are turned on. With regard to the first input buffer 18, in response to the turning on of the transistor $Q_1$ of the first input buffer 18, the inverter 20 outputs a "low" level signal at its output terminal 19 ($\overline{A}$) connected to the gate electrodes of the transistor $Q_3$ and $Q_6$, and a "high" level signal at its output terminal 21 (A). Therefore, the transistors $Q_3$ and $Q_6$ turn off, and the transistors $Q_4$ and $Q_5$ turn on, so that the negative output $\overline{A}$ of the address buffer becomes "low" and the positive output A of the address buffer becomes "high."

If the "low" level signal is applied to the input terminal 17 of the address buffer of FIG. 3, both the transistors $Q_1$ and $Q_7$ are in the turned off condition. In this condition, the clamp transistors $Q_{11}$ and $Q_{12}$ are turned off and the shut off transistors $Q_{13}$ and $Q_{14}$ are turned on as mentioned above. The output of the first input buffer $\overline{A}$ is "high," and thus, the output 19 ($\overline{A}$) of the inverter 20 is "high" and the output 21 (A) of the inverter 20 is "low." Therefore, the transistors $Q_3$ and $Q_6$ are turned on, and the transistors $Q_4$ and $Q_5$ are turned off, so that the negative output $\overline{A}$ of the address buffer becomes "high" and the positive output A of the address buffer becomes "low."

When the operation tests of the memory device are effected, a test address signal A' having the "high" level higher than that of the address signal A which is used in the usual operation and having the same "low" level as that of the address signal A is used. If the test address signal A' is "high," both of the transistors $Q_1$ and $Q_7$ turn on, and the transistor $Q_9$ turns off, so that the output X of the second input buffer 29 becomes "low" and the output Y of the second input buffer 26 becomes "high." Therefore, the shut off transistors $Q_{13}$ and $Q_{14}$ are turned off, and the clamp transistors $Q_{11}$ and $Q_{12}$ are turned on. In this condition, both the negative output $\overline{A}$ and the positive output A of the address buffer of FIG. 3 become "low," so that two word lines of the memory device can be selected through the word address decoder illustrated in FIG. 2.

If the test address signal A' is "low," the operation of the address buffer of FIG. 3 is the same as that in the condition when the usual address signal A of "low" level is applied to the input terminal 17. Therefore, description of the operation thereof in this condition is omitted.

In the address buffer of FIG. 3, the transistor $Q_7$ of the second input buffer 26 has a higher threshold level than that of the transistor $Q_1$ of the first input buffer 18. In order to obtain the higher threshold level of the transistor $Q_7$, the thickness of an insulation layer between a gate electrode and a substrate of the transistor $Q_7$ is made, for example, ten times as large as that of the transistor $Q_1$, and the impurity concentration of the substrate of the transistor $Q_7$ is made, for example, several times as large as that of the transistor $Q_1$. Consequently, the threshold level of the transistor $Q_7$ becomes about 10 to 15 volts. On the other hand, the threshold level of the transistor $Q_1$ is about 0.5 through 1 volt.

Figure 4:
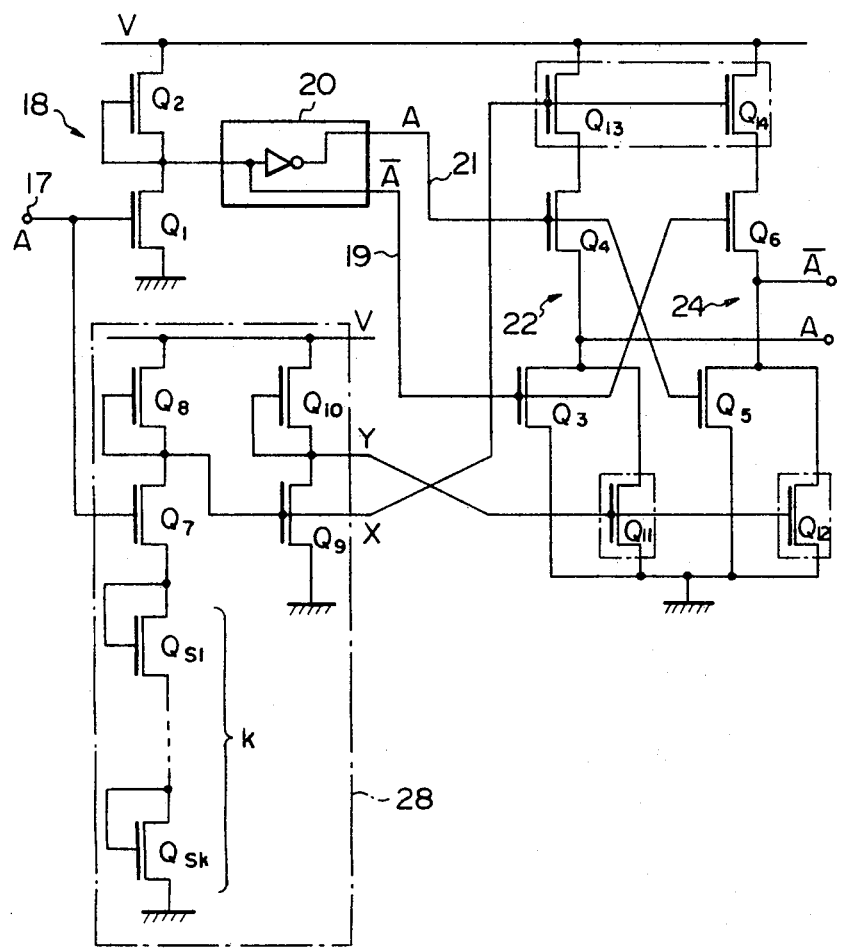
FIG. 4 is a circuit diagram illustrating a second embodiment of a word address buffer circuit in accordance with the present invention.

FIG. 4 illustrates a second embodiment of the present invention. In FIG. 4, a series connection of k transistors $Q_{S1}, Q_{S2}, ---, Q_{Sk}$ is connected between the source electrode of the transistor $Q_7$ and the ground. The gate electrode of each of the transistors $Q_{S1}, Q_{S2}, ---, Q_{Sk}$ is connected to the drain electrode of the same transistor. The transistors $Q_{S1}, Q_{S2}, ---, Q_{Sk}$ play a role in increasing the threshold level of the transistor $Q_7$ of the second input buffer 28. The threshold level of the transistor $Q_7$ is increased by about 1.5 through 2 V per each of the transistors $Q_{S1}, Q_{S2}, ---, Q_{Sk}$. The other parts of the circuit of FIG. 4 are the same as those of the circuits of FIG. 3, and the operation of the circuit of FIG. 4 is the same as that of the circuit of FIG. 1.

Figure 5:
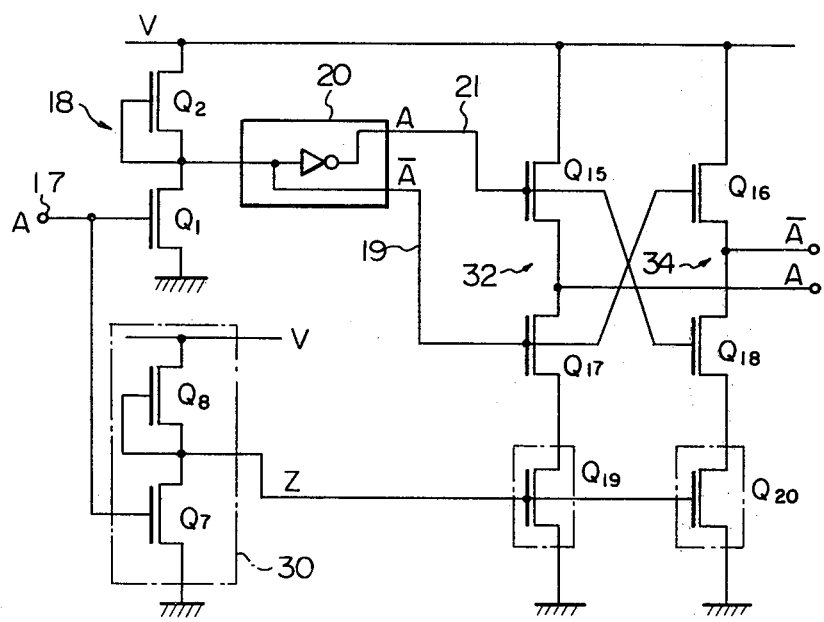
FIG. 5 is a circuit diagram illustrating a third embodiment of a word address buffer circuit in accordance with the present invention.

FIG. 5 illustrates a third embodiment of the word address buffer circuit of the present invention. The word address buffer circuit of FIG. 5 comprises: a first input buffer 18 and an inverter circuit 20, which are the same as those in the word address buffer of FIG. 3; a positive output buffer 32 consisting of field effect transistors $Q_{15}$ and $Q_{17}$; a negative output buffer 34 consisting of field effect transistors $Q_{16}$ and $Q_{18}$; a second input buffer 30 consisting of field effect transistors $Q_7$ and $Q_8$, and; shut off transistors $Q_{19}$ and $Q_{20}$ whose main current paths are respectively connected in series between the source electrodes of the transistors $Q_{17}$ and $Q_{18}$ and the ground. In this circuit, the transistor $Q_7$ of the second input buffer has a higher threshold level than the transistor $Q_1$, as in the embodiment of FIG. 3. The transistors $Q_{15}$ and $Q_{16}$ of the positive output buffer 32 and the negative output buffer 34, respectively are both depletion type transistors, and the other transistors $Q_{17}, Q_{18}, Q_{19}$ and $Q_{20}$ are enhancement type transistors.

Operation of the address buffer circuit of FIG. 5 will now be described. When a usual reading out or writing in operation is effected, the address signal A having a usual "high" or "low" level, for example 5 V or 0 V, is applied to the input terminal 17. In this condition, the transistor $Q_7$ of the second input buffer 30 does not turn on, and thus, the output Z of the second input buffer 30 is "high," so that the shut off transistors $Q_{19}$ and $Q_{20}$ are both in a turned on status. Therefore, in this status, the operation of the address buffer of FIG. 5 is the same as the usual operation of the address buffer of FIG. 3.

When the operation tests of the memory device are effected, the test address signal A' having the "high" level which is higher than that of the usual address signal A is applied to the input terminal 17. In this condition, the transistor $Q_7$ of the second input buffer 30 is turned on and the output Z of the second input buffer 30 becomes "low." Therefore, the shut off transistors $Q_{19}$ and $Q_{20}$ are both turned off, so that both the positive output A and the negative output $\overline{A}$ of the address buffer of FIG. 5 become "high." Since both the transistors $Q_{15}$ and $Q_{16}$ are depletion type transistors, both the transistors do not completely cut off even if a "low" voltage, i.e., 0 V is applied to the gate electrodes thereof. Therefore, the signal levels of both the positive output and the negative output of the address buffer are caused to be nearly equal to the power supply voltage V.

The address buffer of FIG. 5 can be used with the word address decoder which consists, for example, of a plurality of AND gates and which selects a word line when all "1," i.e., all "high," signals are applied to inputs thereof.

In the above descriptions, the word address buffer used in the EPROM device was described. However, it should be noted that the present invention can also be adopted to the address buffer used in another memory device, such as a bipolar RAM device, or the present invention can be adopted to the bit address buffer.

According to the present invention, both the negative output and the positive output are caused to be "low" or "high" due to the supply of the voltage which is higher than usual "high" voltage. Therefore, a plurality of word lines, for example, two or more lines, can be selected at the same time, so that the time required to conduct the operation tests and, especially the time required to conduct the operation tests including a writing-in process, can be greatly reduced.

We claim:

1. An address buffer circuit for receiving an input address signal, having first and second levels, and for supplying, as outputs, a positive output signal (A) and a negative output signal ($\overline{A}$) to an address decoder, said address buffer circuit comprising:
   a first input circuit for receiving the input address signal, said first input circuit operated by the first level of the input address signal;
   a second input circuit for receiving the input address signal and for providing, as an output, a switching signal when the second level of the input address signal is applied thereto;
   inverter means, operatively connected to said first input circuit, for providing positive and negative input address signals;
   a positive output buffer, operatively connected to said inverter means, for providing said positive output signal (A) to said address decoder;
   a negative output buffer, operatively connected to said inverter means, for providing said negative output signal ($\overline{A}$) to said address decoder; and
   clamping means, operatively connected to said positive and negative output buffers and to said second input circuit, for clamping both said positive output signal (A) and said negative output signal ($\overline{A}$) to a "high" or "low" logic level when said switching signal from said second input circuit is supplied thereto.

2. An address buffer circuit as set forth in claim 1, wherein said input address signal also has a base level of a first logic level and wherein the first level of said input address signal is of a second logic level higher than said first logic level.

3. An address buffer circuit as set forth in claim 2, wherein the second level of the input address signal is of a third logic level higher than said second logic level and wherein said second input circuit outputs the switching signal when the input address signal of the second level is applied thereto.

4. An address buffer circuit as set forth in claim 1, wherein said first input circuit comprises a field effect transistor circuit and wherein said second input circuit comprises a field effect transistor having an insulation layer between the gate electrode and the substrate which is of a thickness greater than that of the corresponding insulation layer of the field effect transistors comprising said first input circuit.

5. An address buffer circuit as set forth in claim 1, wherein said first input circuit comprises a field effect transistor circuit, and wherein said second input circuit comprises a field effect transistor having a semiconductor substrate which has a higher impurity concentration than that of the semiconductor substrates of the field effect transistors comprising said first input circuit.

6. An address buffer circuit as set forth in claim 1, wherein said second input circuit comprises at least one gate-drain coupled field effect transistor and a field effect transistor having a source electrode which is connected to ground through said at least one gate-drain coupled field effect transistor.

7. An address buffer circuit as set forth in claim 1, 2, 3, 4, 5 or 6, wherein each of said positive and negative output buffers has an output terminal, wherein said clamping means comprises first and second switching transistors which are respectively connected between the output terminal of said positive output buffer and the ground, and between the output terminal of said negative output buffer and the ground, and wherein said first and second switching transistors are turned on by said switching signal from said second input circuit.

8. An address buffer circuit as set forth in claim 7, further comprising a voltage source, wherein each of said positive and negative output buffers has a voltage supply terminal, and wherein said clamping means further comprises first and second shut off transistors which are respectively connected between the voltage supply terminal of said positive output buffer and the voltage source and between the voltage supply terminal of said negative output buffer and the voltage source, said first and second shut off transistors being cut off by said switching signal from said second input circuit.

9. An address buffer circuit as set forth in claim 1, 2, 3, 4, 5 or 6, wherein each of said positive and negative output buffers has a grounding terminal, and wherein said clamping means comprises first and second shut off transistors which are respectively connected between the grounding terminal of said positive output buffer and ground, and between the grounding terminal of said negative output buffer and ground, said first and second shut off transistors being cut off by said switching signal from said second input circuit.

10. An address buffer circuit receiving an input address signal having first, second and third logic levels, and providing an output address signal and an inverted output address signal to an address decoder, said address buffer circuit comprising:
   input means for receiving the input address signal and for generating first and second output signals;
   an input buffer circuit for receiving the input address signal and for providing, as an output, a switching signal when the third level of the input address signal is received;
   a positive output buffer circuit, operatively connected to said input means, for receiving said first output signal and for providing said output address signal to the address decoder;
   a negative output buffer circuit, operatively connected to said input means, for receiving said second output signal and for providing said inverted output address signal to the address decoder;
   clamping means, operatively connected to said positive and negative output buffer circuits and to said input buffer circuit, for clamping both said output address signal and said inverted output address signal to a predetermined logic level when said switching signal is received from said input buffer circuit.

11. An address buffer circuit as set forth in claim 10, wherein the input address signal is at the third level when a testing operation is to be performed and wherein said input buffer circuit provides said switching signal in response to the third level of the input address signal.

12. An address buffer circuit as set forth in claim 10, wherein said input means comprises a first field effect transistor and wherein said input buffer circuit comprises a second field effect transistor having an insulation layer between the gate electrode and the substrate which is of a thickness greater than that of the corresponding insulation layer of said first field effect transistor.

13. An address buffer circuit as set forth in claim 10, wherein said input means comprises a first field effect transistor and wherein said input buffer circuit comprises a second field effect transistor having a semiconductor substrate which has a higher impurity concentration than that of the semiconductor substrate of said first field effect transistor.

14. An address buffer circuit as set forth in claim 10, wherein said input buffer circuit comprises at least two gate-drain coupled field effect transistors and a first field effect transistor having a source electrode which is connected to ground through said at least two gate-drain coupled field effect transistors.

15. An address buffer circuit as set forth in claim 10 or 14, wherein each of said positive and negative output buffer circuits has an output terminal, wherein said clamping means comprises first and second switching transistors which are respectively connected between the output terminal of said positive output buffer circuit and the ground, and between the output terminal of said negative output buffer circuit and the ground, and wherein said first and second switching transistors are turned on by said switching signal from said input buffer circuit.

16. An address buffer circuit as set forth in claim 15, further comprising a voltage source, wherein each of said positive and negative output buffer circuits has a voltage supply terminal, and wherein said clamping means further comprises first and second shut off transistors which are respectively connected between the voltage supply terminal of said positive output buffer circuit and the voltage source and between the voltage supply terminal of said negative output buffer circuit and the voltage source, said first and second shut off transistors being shut off by said switching signal from said input buffer circuit.

17. An address buffer circuit as set forth in claim 10 or 11, wherein each of said positive and negative output buffer circuits has a grounding terminal, and wherein said clamping means comprises first and second shut off transistors respectively connected between the grounding terminal of said positive output buffer circuit and ground, and between the grounding terminal of said negative output buffer circuit and ground, said first and second shut off transistors being shut off by said switching signal from said input buffer circuit.

* * * * *

UNITED STATES PATENT AND TRADEMARK OFFICE
CERTIFICATE OF CORRECTION

PATENT NO. : 4,342,103
DATED : JULY 27, 1982
INVENTOR(S) : MITSUO HIGUCHI ET AL.

It is certified that error appears in the above-identified patent and that said Letters Patent is hereby corrected as shown below:

Column 1, line 29, after "particular" insert --,--;
         line 42, after "problem," insert --the--;
         line 65, "1." should be --1;--.
Column 2, line 42, "same" should be --sense--.
Column 3, line 67, "A" (second occurrence) should be --$\bar{A}$--.
Column 4, line 52, "29" should be --26--.
Column 5, line 37, delete "the" (second occurrence);
         line 42, after "respectively" insert --,--;
         line 46, "reading out" should be --reading-out--;
         and "writing" should be --writing- --.
Column 6, line 22, "tests and," should be --tests, and--.

Signed and Sealed this

Twenty-eighth Day of December 1982

[SEAL]

Attest:

GERALD J. MOSSINGHOFF

Attesting Officer    Commissioner of Patents and Trademarks